United States Patent
Ritchie et al.

(10) Patent No.: US 9,340,866 B2
(45) Date of Patent: May 17, 2016

(54) SUBSTRATE SUPPORT WITH RADIO FREQUENCY (RF) RETURN PATH

(75) Inventors: Alan Ritchie, Menlo Park, CA (US); Donny Young, Cupertino, CA (US); Wei W. Wang, Santa Clara, CA (US); Ananthkrishna Jupudi, Milpitas, CA (US); Thanh X. Nguyen, San Jose, CA (US); Kirankumar Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 183 days.

(21) Appl. No.: 13/435,766

(22) Filed: Mar. 30, 2012

(65) Prior Publication Data

US 2013/0256126 A1    Oct. 3, 2013

(51) Int. Cl.
| | |
|---|---|
| C23C 14/50 | (2006.01) |
| C23C 14/34 | (2006.01) |
| H01J 37/32 | (2006.01) |
| H01J 37/34 | (2006.01) |

(52) U.S. Cl.
CPC ............... *C23C 14/34* (2013.01); *H01J 37/321* (2013.01); *H01J 37/32091* (2013.01); *H01J 37/32623* (2013.01); *H01J 37/32651* (2013.01); *H01J 37/32706* (2013.01); *H01J 37/32715* (2013.01); *H01J 37/3405* (2013.01); *H01J 37/3411* (2013.01)

(58) Field of Classification Search
CPC .................... H01J 37/32715; H01J 37/32091; H01J 37/321
USPC ................... 204/298.08, 298.15; 156/345.44, 156/345.48
See application file for complete search history.

(56) References Cited

U.S. PATENT DOCUMENTS

| | | | |
|---|---|---|---|
| 6,221,221 B1* | 4/2001 | Al-Shaikh et al. ........ | 204/298.02 |
| 6,652,713 B2* | 11/2003 | Brown et al. ............ | 156/345.51 |
| 7,083,702 B2* | 8/2006 | Blonigan et al. ......... | 156/345.47 |
| 7,244,344 B2* | 7/2007 | Brown .................. | C23C 14/046 |
| | | | 204/298.06 |
| 8,066,857 B2 | 11/2011 | Li et al. | |
| 8,313,578 B2 | 11/2012 | Carducci et al. | |
| 2002/0029093 A1 | 3/2002 | Miller et al. | |
| 2003/0029564 A1 | 2/2003 | Brown et al. | |
| 2011/0303960 A1 | 12/2011 | Cao et al. | |

OTHER PUBLICATIONS

U.S. Appl. No. 13/435,949, filed Mar. 30, 2012, Young et al.

(Continued)

*Primary Examiner* — Jason M Berman
(74) *Attorney, Agent, or Firm* — Moser Taboada; Alan Taboada (57) ABSTRACT

Apparatus for processing substrates are provided herein. In some embodiments, an apparatus for processing a substrate includes a substrate support that may include a dielectric member having a surface to support a substrate thereon; one or more first conductive members disposed below the dielectric member and having a dielectric member facing surface adjacent to the dielectric member; and a second conductive member disposed about and contacting the one or more first conductive members such that RF energy provided to the substrate by an RF source returns to the RF source by traveling radially outward from the substrate support along the dielectric member facing surface of the one or more first conductive members and along a first surface of the second conductive member disposed substantially parallel to a peripheral edge surface of the one or more first conductive members after travelling along the dielectric layer facing surface.

20 Claims, 5 Drawing Sheets

(56) References Cited

OTHER PUBLICATIONS

U.S. Appl. No. 13/435,956, filed Mar. 30, 2012, Ritchie et al.
U.S. Appl. No. 13/436,766, filed Mar. 30, 2012, Young et al.
International Search Report and Written Opinion mailed Jul. 18, 2013 for PCT Application No. PCT/US2013/033686.

\* cited by examiner

SUBSTRATE SUPPORT WITH RADIO FREQUENCY (RF) RETURN PATH

FIELD

Embodiments of the present invention generally relate to substrate processing systems.

BACKGROUND

Substrate processing systems using radio frequency (RF) generated plasmas, require a return path of RF currents generated during processing back to a source, such as the RF source that supplied the current. In some embodiments, the return path may include the current traveling through a substrate support along a floor of the processing system and then ultimately along a wall of the processing system back to the source. However, the inventors have discovered, that when operating under certain processing conditions, arcing between chamber components, such as between the substrate support and adjacent chamber components, and/or stray plasma can undesirably occur, leading to component damage and/or generation of particles that can further undesirably contaminate a substrate disposed in the processing system.

Accordingly, the inventors have provided embodiments of improved substrate supports for use in substrate processing systems.

SUMMARY

Apparatus for processing substrates are provided herein. In some embodiments, an apparatus for processing a substrate includes a substrate support that may include a dielectric member having a surface to support a substrate thereon; one or more first conductive members disposed below the dielectric member and having a dielectric member facing surface adjacent to the dielectric member; and a second conductive member disposed about and contacting the one or more first conductive members such that RF energy provided to the substrate by an RF source returns to the RF source by traveling radially outward from the substrate support along the dielectric member facing surface of the one or more first conductive members and along a first surface of the second conductive member disposed substantially parallel to a peripheral edge surface of the one or more first conductive members after travelling along the dielectric layer facing surface.

In some embodiments, an apparatus may include a substrate processing system comprising a process chamber having an inner volume; a shield to separate the inner volume into a processing volume and a non-processing volume and extending toward a ceiling of the process chamber; and a substrate support disposed below the shield, wherein the substrate support further includes a dielectric member having a surface to support a substrate thereon; one or more first conductive members disposed below the dielectric layer and having a dielectric member facing surface adjacent to the dielectric member; and a second conductive member disposed about and contacting the one or more first conductive members such that an RF energy provided to the substrate by an RF source returns to the RF source by traveling from one or more first conductive members to the second conductive member to the shield, wherein the RF energy travels radially outward from the substrate support along the dielectric member facing surface of the one or more first conductive members and along a first surface of the second conductive member disposed substantially parallel to a peripheral edge surface of the one or more first conductive members after travelling along the dielectric member facing surface.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of apparatus for processing substrates are provided herein. The inventive apparatus may include a substrate support configured to provide an RF return path between the substrate support and an adjacent chamber component, such as a process kit shield which surrounds a processing volume of a process chamber. The inventive apparatus may advantageously provide a low impedance return path for RF currents generated during processing. In some exemplary embodiments, the inventive apparatus may advantageously reduce or prevent arcing between the substrate support and adjacent components, such as the process kit shield, when higher currents, such as about 150 amperes (A) result from providing source frequencies of about 40 MHz or higher and power levels of up to about 6 kW, at pressures of about 60-140 mTorr. For example, such source and chamber parameters may be utilized to form a plasma or the like. Other embodiments and advantageous benefits of the present invention are discussed below.

Figure 1:
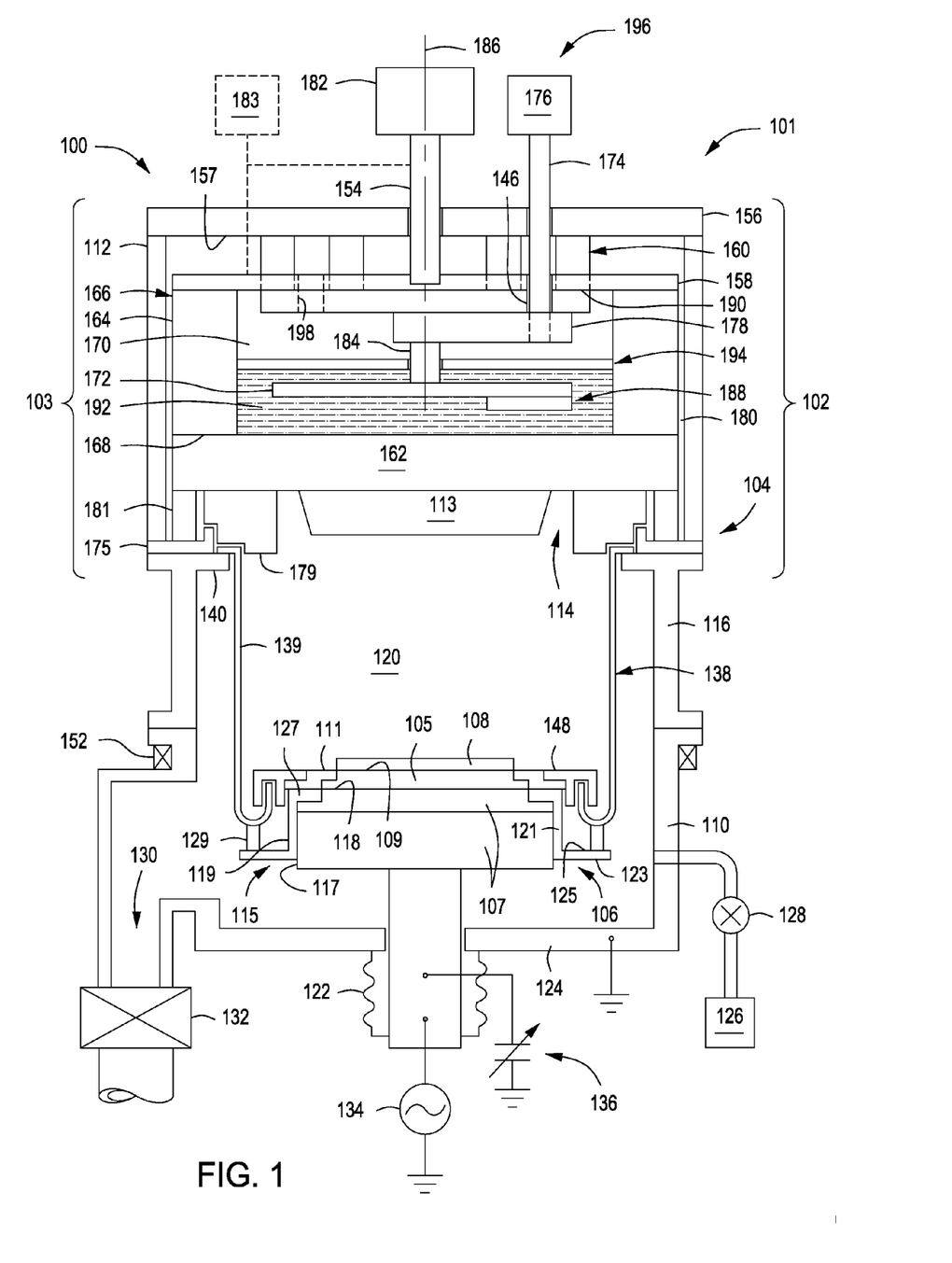
FIG. 1 depicts a schematic cross sectional view of a process chamber having a substrate support in accordance with some embodiments of the present invention.

FIG. 1 depicts a simplified, cross-sectional view of a PVD chamber 100 in accordance with some embodiments of the present invention. Examples of PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the inventive apparatus disclosed herein.

In some embodiments of the present invention, the PVD chamber 100 includes a chamber lid 101 disposed atop a process chamber 104 and removable from the process chamber 104. The chamber lid 101 may include a target assembly 102 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g. a bottom shield 138 as discussed below) and ultimately back to the grounding assembly 103 of the chamber lid 101. The RF power source 182 may provide RF power to the target assembly 102 as discussed below.

The substrate support 106 has a material-receiving surface facing a principal surface of a target 114 and supports the substrate 108 to be sputter coated in planar position opposite to the principal surface of the target 114. The substrate support 106 may include a dielectric member 105 having a substrate processing surface 109 for supporting the substrate 108 thereon. In some embodiments, the substrate support 108 may include one or more first conductive members 107 disposed below the dielectric member 105 and having a dielectric member facing surface 118 adjacent to the dielectric member 105. For example, the dielectric member 105 and the one or more first conductive members 107 may be part of an electrostatic chuck, RF electrode, or the like which may be used to provide chucking or RF power to the substrate support 106.

The substrate support 106 may support the substrate 108 in a first volume 120 of the process chamber 104. The first volume 120 may be a portion of the inner volume of the process chamber 104 that is used for processing the substrate 108 and may be separated from the remainder of the inner volume (e.g., a non-processing volume) during processing of the substrate 108. The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, to surround the processing, or first volume of the process chamber 104 and to protect other chamber components from damage and/or contamination from processing. In some embodiments, the shield may include a grounded bottom shield 138 connected to a ledge 140 of an upper grounded enclosure wall 116 of the process chamber 104. As illustrated in FIG. 1, the chamber lid 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 101. However, other RF return paths are possible, such as via the grounded bottom shield 138.

The bottom shield 138 extends downwardly and may include one or more sidewalls 139 configured to surround the first volume 120. The bottom shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition. Although discussed above as the substrate support 106 being moveable relative to the shield 138 and the first ring 148, in some embodiments, it may be possible that the substrate support 106 is stationary and the shield 138 and the first ring 148 are moveable relative to the substrate support 106.

An additional dielectric ring 111 (e.g., a deposition ring) may be used to shield the periphery of the substrate 108 from deposition. For example, the dielectric ring 111 may be disposed about a peripheral edge of the substrate support 106 and adjacent to the substrate processing surface 109 as illustrated in FIG. 1. In some embodiments, the dielectric ring 111 may shield exposed surfaces of the one or more first conductive members 107 as shown.

The substrate support 106 may include a second conductive member 115 to facilitate an RF return path between the substrate support 106 and the bottom shield 138. The second conductive member 115 may include any suitable conductive materials, such as including one or more of stainless steel, copper (Cu), nickel (Ni), any suitable metal alloys, and/or any conductive flexible materials available in thin sheets, or the like. For example, as illustrated in FIG. 1, the second conductive member 115 may be disposed about and in contact with the one or more first conductive members 107 such that RF energy provided to the substrate 108 by an RF source (e.g., an RF power source 182 as discussed below) returns to the RF source by traveling radially outward from the substrate support along the dielectric member facing surface 118 of the one or more first conductive members 107 and along a first surface 119 of the second conductive member 115 disposed substantially parallel to a peripheral edge surface 117 of the one or more first conductive members 107 after travelling along the dielectric member facing surface 118.

Providing the second conductive member 115 advantageously provides a low impedance return path for RF currents generated during processing. In some embodiments, the second conductive member 115 may be flexible to permit compression or expansion of a gap between the second conductive member 115 and a bottom of the shield 138. Such flexibility may allow optimization of a spacing between the source material 113 of the target 114 and the substrate 108 without having to alter the RF return path from the substrate support 106 to the shield 138 via the second conductive member 115.

In some embodiments, such as those illustrated in FIG. 1, the second conductive member 115 may include a body 121 disposed about the one or more first conductive members 107. For example, in some embodiments, the body 121 may have a cylindrical tubular form. The body 121 may include the first surface 119, where the first surface 119 is disposed on a peripheral edge surface opposing side of the body 121. A first lip 123 may extend radially outward from a lower end of the body 121 and includes a second surface 125. The second surface 125 is a radially outward extending surface, wherein RF energy travels along the second surface 125 after travelling along the first surface 119. The second conductive member 115 may further include a second lip 127 extending radially inward from an upper end of the body 121 and covering a peripheral edge of the dielectric member facing surface 118 of the one or more first conductive members 107.

Figure 1A:
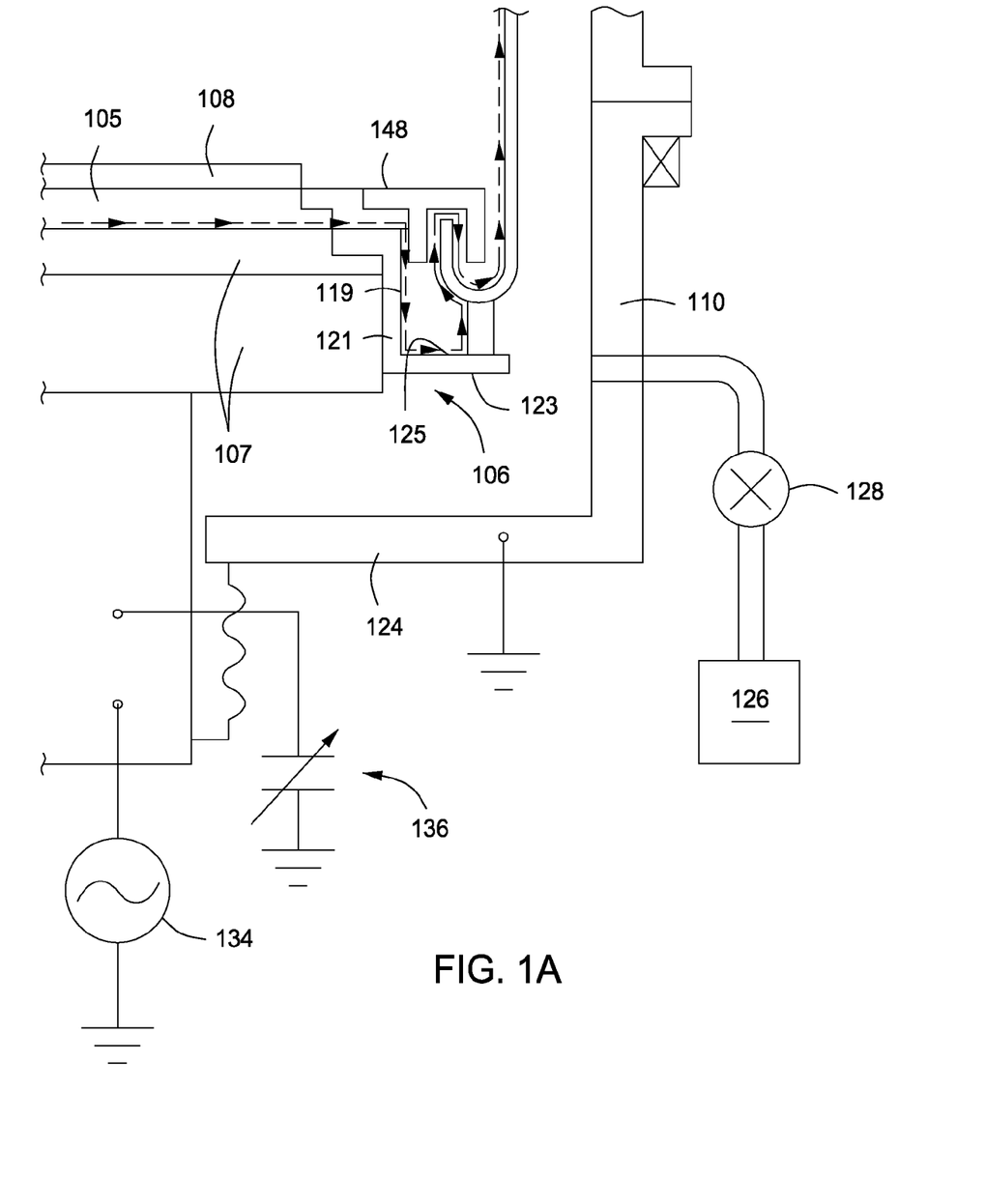
FIG. 1A depicts a partial schematic cross sectional view of the substrate support of FIG. 1 in accordance with some embodiments of the present invention.

FIG. 1A depicts the substrate support 106 and second conductive member 115 originally illustrated in FIG. 1 in a further magnified view. In operation, as illustrated by the dotted line in FIG. 1A, an RF current may travel radially outward along the dielectric member facing surface 118 of the one or more first conductive members 107. Next, the RF current may continue to travel radially outward along a surface of the second lip 127 disposed adjacent to the dielectric member facing surface 118. The RF current may continue from the surface of the second lip 127 to the first surface 119 of the body, and then to the second surface 125 of the first lip 123. From the second surface 125, the RF current may travel along a plurality of conductive elements 129 disposed on the second surface 125. The conductive elements 129 may be disposed about the body 121 on the second surface, and are discussed in further detail below. From the plurality of conductive elements 129, the RF current may then travel along the bottom shield 138 toward the grounding assembly 103 and ultimately to the RF power source 182.

Figure 2:
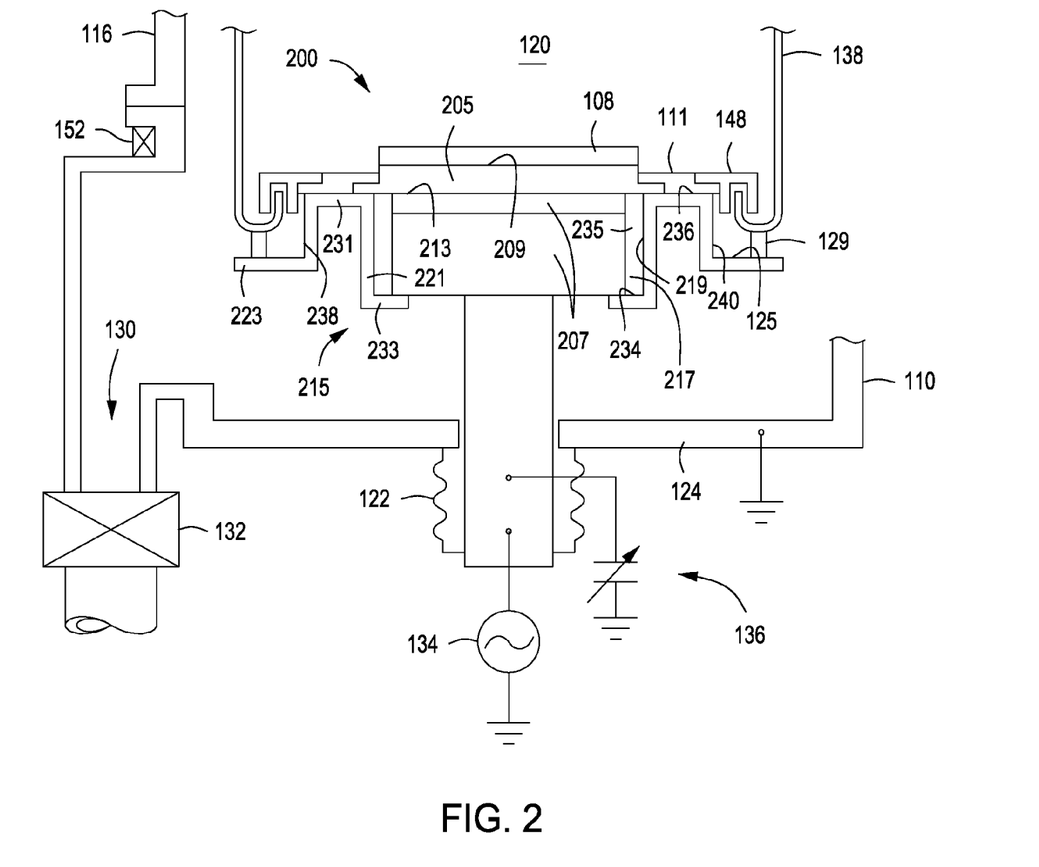
FIG. 2 depicts a partial schematic cross sectional view of a process chamber having a substrate support in accordance with some embodiments of the present invention.

FIG. 2 depicts alternative embodiments of a second conductive member of a substrate support. The substrate support of FIG. 2 may be generally similar to the substrate support described above except as noted below. As shown in FIG. 2, a substrate support 200 may include a dielectric member 205 having a surface 209 for supporting the substrate 108 thereon. The substrate support 200 may include one or more first conductive members 207 disposed below the dielectric member 205 and having a dielectric member facing surface 213 adjacent to the dielectric member 205. As illustrated in FIG. 2, the dielectric member 205 may extend in radially outward direction beyond a peripheral edge surface 217 of the one or more first conductive members 207.

The substrate support 200 may include a second conductive member 215 to facilitate an RF return path between the substrate support 200 and the bottom shield 138. The second conductive member 215 may include any suitable conductive materials, such as including those discussed above for the second conductive member 115. For example, as illustrated in FIG. 2, the second conductive member 215 may be disposed about and contacting the one or more first conductive members 207 such that RF energy provided to the substrate 108 by an RF source (e.g., the RF power source 182 as discussed below) returns to the RF source by traveling radially outward from the substrate support along the dielectric layer facing surface 213 of the one or more first conductive members 207 and along the peripheral edge surface 217 on the one or more first conductive members 207 and a first surface 219 of the second conductive member 215 disposed along a peripheral edge surface 117 of the one or more first conductive members 107 after travelling along the dielectric member facing surface 213.

In some embodiments, such as those illustrated in FIG. 2, the second conductive member 215 may include a body 221 disposed about the one or more first conductive members 207. The body 221 may include the first surface 119, where the first surface 119 is disposed on a peripheral edge surface facing side of the body 221. The second conductive member 215 may further include a first lip 223, a third lip 231, and a fourth lip 233, and other elements as discussed below.

The fourth lip 233 may extend radially inward from a lower end of the body 221 and below the one or more first conductive members 207. For example, the fourth lip 233 may be used to at least partially secure the second conductive member 215 to the substrates support 200, such as by way of fasteners, bolts, or the like disposed through the fourth lip 233 and into a lower side of the one or more first conductive members 207. The fourth lip 233 may facilitate the formation of a gap 235 between the first surface 219 and the peripheral edge surface 217 of the one or more first conductive members 207. In operation, RF energy may traverse the gap by traveling from the peripheral edge surface 217 to a fourth surface 234 of the fourth lip 233 to the first surface 219 of the body 221.

The third lip 231 may extending radially outward from an upper end of the body 221 and further may extend at least partially along a lower surface of the dielectric member 205. The third lip 231 may include a third surface 236, wherein RF energy travels from the first surface 219 to the third surface 236. The third surface 236 may be disposed on a dielectric member facing side of the third lip 231.

The second conductive member 215 may include a protrusion 238 which extends downward from a body opposing end of the third lip 231. The protrusion may include a surface 240, wherein RF energy travels from the third surface 236 to the surface 240.

The first lip 223 may extend radially outward from a lower end of the protrusion 238. The first lip 223 may include a second surface 225. The second surface 225 may be a radially outward extending surface, wherein RF energy travels along the second surface 225 after travelling along the surface 240 of the protrusion 238.

Figure 2A:
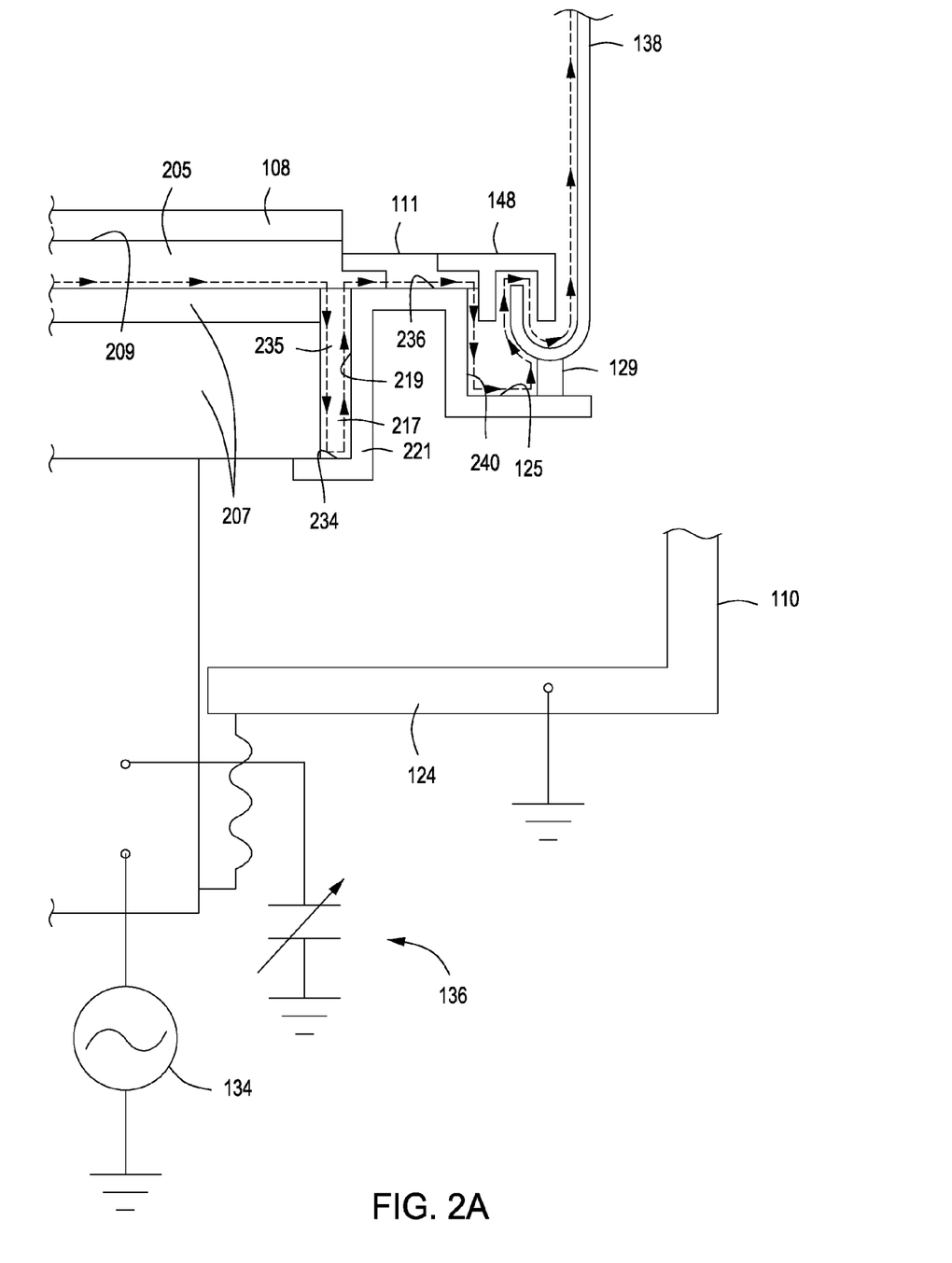
FIG. 2A depicts a partial schematic cross sectional view of the substrate support of FIG. 2 in accordance with some embodiments of the present invention.

FIG. 2A depicts the substrate support 106 and second conductive member 215 originally illustrated in FIG. 2 in a further magnified view. In operation, as illustrated by the dotted line in FIG. 2A, an RF current may travel radially outward along the dielectric member facing surface 213 of the one or more first conductive members 207. Next, the RF current may continue to travel along the peripheral edge surface 217 of the one or more first conductive members 207 and then radially outward along the fourth surface 234 of the fourth lip 233. The RF current may continue from the fourth surface 234 to the first surface 219 of the body 221, and then to the third surface 236 of the third lip 231. From the third surface 236, the RF current may travel downward along the surface 240 of the protrusion and then radially outward along the second surface 225 of the first lip 223. From the second surface 225, the RF current may travel along the plurality of conductive elements 129 disposed on the second surface 225. The conductive elements 129 may be disposed about the body 221 on the second surface 225, and are discussed in further detail below. From the plurality of conductive elements 129, the RF current may then travel along the bottom shield 138 toward the grounding assembly 103 and ultimately to the RF power source 182.

Figure 3A:
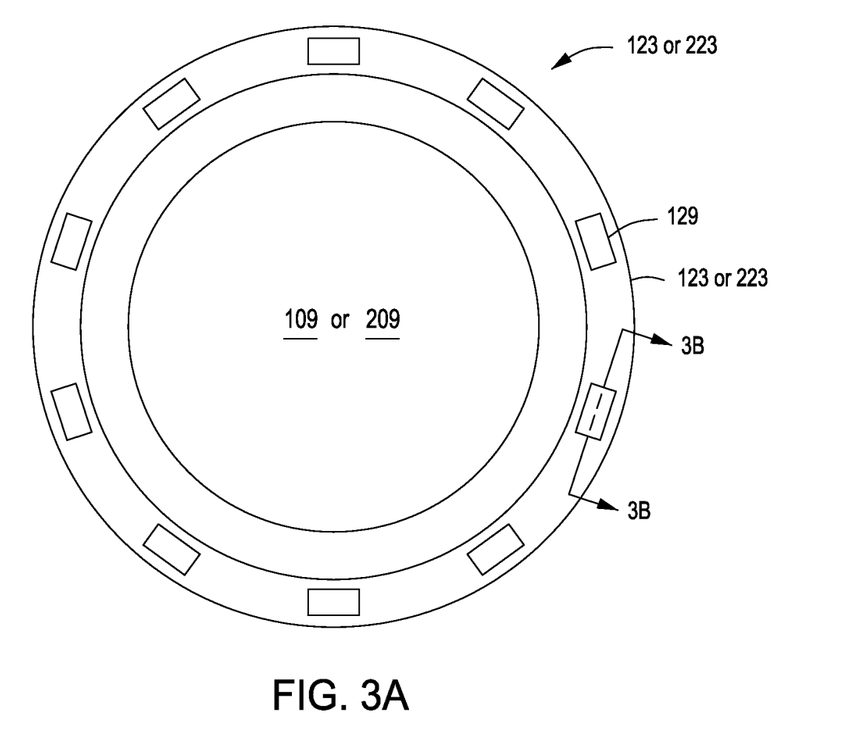
FIGS. 3A-B respectively depict top and side schematic views of a plurality of conductive elements of a substrate support in accordance with some embodiments of the present invention.
Figure 3B:
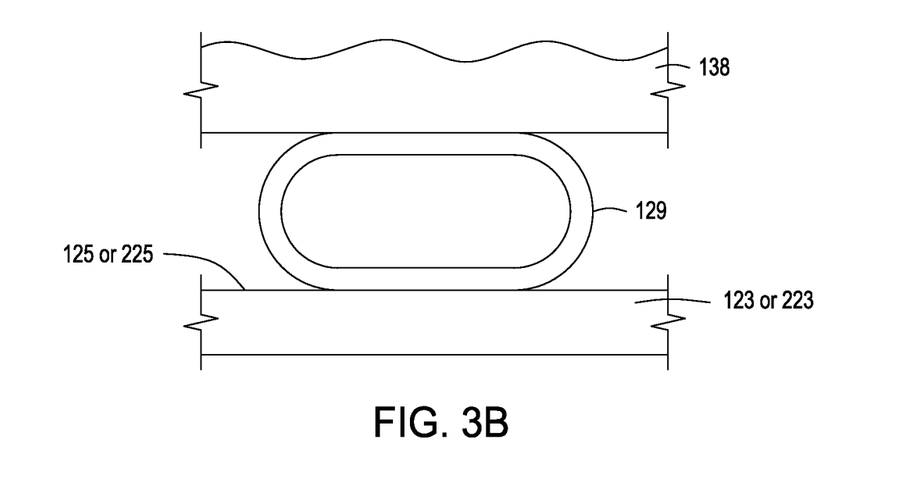

FIGS. 3A-B depict the conductive elements 129 in accordance with some embodiments of the present invention. The embodiments of the conductive elements as illustrated in FIGS. 3A-B may be utilized with any embodiments of the second conductive member (e.g., 115 or 215) as discussed above. For example, as illustrated in FIG. 3A in top down view of the substrate support (106 or 200), the plurality of conductive elements 129 may be disposed about the second surface (125 or 225) of the first lip (123 or 223) of the second conductive member (115 or 215). The size and number of the plurality of conductive elements 129 may vary as desired to provide a desired RF return path for RF currents generated during processing. The plurality of conductive elements 129 may be symmetrically disposed about the substrate support 106 (200) as illustrated. However, other arrangements, such as non-symmetrical arrangements of the conductive elements 129 may be possible, for example, depending on how RF current is being supplied to the system 100. As discussed herein, the RF current may be provided symmetrically through an electrode coincident with a central axis of the system 100. However, in other embodiments, the RF source may be coupled asymmetrically to the target (or other electrode) in the processing system.

FIG. 3B depicts an exemplary conductive element 129. In some embodiments, the conductive element 129 may be in the shape of a loop, such as a circle, oval, or the like, wherein a bottom side of the loop contacts the second surface (125 or 225) and an upper side of the loop contacts the u-shaped portion of the bottom shield 138. Other embodiments of the conductive elements 129 may be possible, such as a continuous element, for example, such as one or more of a continuous spiral seal or gasket, a ball seal, or the like.

Returning to FIG. 1, and in some embodiments, a magnet 152 may be disposed about the process chamber 104 for selectively providing a magnetic field between the substrate support 106 and the target 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extending from the first surface 157 of the grounding plate 156 and surround the target assembly 102. The grounding assembly 103 may include a support member 175 to support the target assembly 102 within the grounding assembly 102.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield 179. The seal ring 181 may be a ring or other annular shape having a desired cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The dark space shield 179 is generally disposed about an outer edge of the target 114, such about an outer edge of a source material 113 of the target 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dielectric dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the process chamber 100, thereby promoting more uniform processing of substrates therein. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target 114. In some embodiments, the support member 175 may be circular, or disc-like in shape, although the shape may vary depending upon the corresponding shape of the chamber lid and/or the shape of the substrate to be processed in the process chamber 100. In use, when the chamber lid 101 is opened or closed, the support member 175 maintains the dark space shield 179 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, or the like. In some embodiments, the target 114 may include a backing plate 162 to support the source material 113. The source material 113 may be disposed on a substrate support facing side of the backing plate 162 as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a desired portion of the cavity 170 (such as a lower portion, as shown) and to prevent the cooling fluid 192 from reaching components disposed on the other side of the divider 194, as discussed below.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between 5 mm and 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158, discussed below). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through the grounding plate 156 and is coupled to a source distribution plate 158. The grounding plate 156 may comprise any suitable conductive material, such as aluminum, copper, or the like. The open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gearbox shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the PVD chamber. As such, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 188 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

While the foregoing is directed to embodiments of the present invention, other and further embodiments of the invention may be devised without departing from the basic scope thereof.

The invention claimed is:

1. A substrate support for use in a physical vapor deposition chamber, comprising:
   a dielectric member having a surface to support a substrate thereon;
   a one or more first conductive members disposed below the dielectric member and having a dielectric member facing surface adjacent to the dielectric member;
   an annular second conductive member disposed about and contacting the one or more first conductive members such that RF energy provided to the substrate by an RF source returns to the RF source via an RF return path by traveling radially outward from the substrate support along the dielectric member facing surface of the one or more first conductive members and along a first surface of the second conductive member disposed substantially parallel to a peripheral edge surface of the one or more first conductive members after travelling along the dielectric member facing surface; and
   a plurality of conductive elements disposed about and contacting the second conductive member, wherein the plurality of conductive elements extend above a surface of the second conductive member such that the plurality of conductive elements selectively contact a shield disposed above the substrate support to complete the RF return path dependent upon a position of the substrate support, and wherein the plurality of conductive elements are axisymmetrically disposed about the substrate support.

2. The substrate support of claim 1, wherein the second conductive member further comprises:
   a second surface extending radially outward, wherein the RF energy travels along the second surface of the second conductive member after travelling along the first surface of the second conductive member, and wherein the plurality of conductive elements are disposed on the second surface.

3. The substrate support of claim 2, wherein the second conductive member further comprises:
   a third surface extending radially outward from the first surface of the second conductive member and disposed between the first and second surfaces of the second conductive member, wherein RF energy travels along the third surface prior to traveling along the second surface of the second conductive member.

4. The substrate support of claim 2, wherein the second conductive member further comprises:
   a body disposed about the one or more first conductive members, wherein the body includes the first surface of the second conductive member;
   a first lip extending radially outward, wherein the first lip includes the second surface of the second conductive member.

5. The substrate support of claim 4, wherein the first lip extends radially outward from a lower end of the body.

6. The substrate support of claim 5, wherein the second conductive member further comprises:
   a second lip extending radially inward from an upper end of the body and covering a peripheral edge of the dielectric member facing surface of the one or more first conductive member.

7. The substrate support of claim 4, wherein the second conductive member further comprises:
   a third lip extending radially outward from an upper end of the body and having a third surface disposed between the first and second surfaces of the second conductive member, wherein RF energy travels along the third surface prior to traveling along the second surface of the second conductive member.

8. The substrate support of claim 7, wherein the third surface is at least partially disposed adjacent to a lower surface of the dielectric member.

9. The substrate support of claim 7, wherein the second conductive member further comprises:
   a protrusion extending downward from a body opposing end of the third lip, wherein the first lip extends radially outward from a lower end of the protrusion.

10. The substrate support of claim 9, wherein the second conductive member further comprises:
    a fourth lip extending radially inward from a lower end of the body and below the one or more first conductive members; and a gap disposed between the peripheral edge surface of one or more first conductive members and the first surface of the body and formed by the fourth lip, wherein the RF energy traverses the gap by traveling from the peripheral edge surface to a fourth surface of the fourth lip to the first surface of the body.

11. The substrate support of claim 2, further comprising:
a plurality of conductive elements disposed on the second surface, wherein the RF energy travels from the second surface into the conductive elements.

12. The substrate support of claim 11, wherein each conductive element is in the shape of a loop.

13. The substrate support of claim 11, wherein the plurality of conductive elements are symmetrically disposed about the substrate support.

14. A substrate processing system, comprising:
a physical vapor deposition process chamber having an inner volume;
a shield to separate the inner volume into a processing volume and a non-processing volume and extending toward a ceiling of the process chamber; and
a substrate support disposed below the shield, wherein the substrate support further comprises:
a dielectric member having a surface to support a substrate thereon;
a one or more first conductive members disposed below the dielectric member and having a dielectric member facing surface adjacent to the dielectric member;
an annular second conductive member disposed about and contacting the one or more first conductive members such that an RF energy provided to the substrate by an RF source via an RF return path returns to the RF source by traveling from one or more first conductive members to the second conductive member to the shield, wherein the RF energy travels radially outward from the substrate support along the dielectric member facing surface of the one or more first conductive members and along a first surface of the second conductive member disposed substantially parallel to a peripheral edge surface of the one or more first conductive members after travelling along the dielectric member facing surface; and
a plurality of conductive elements disposed about and contacting the second conductive member, wherein the plurality of conductive elements selectively contact the shield to complete the RF return path depending on a position of the substrate support, and wherein the plurality of conductive elements are axisymmetrically disposed about the substrate support.

15. The substrate processing system of claim 14, wherein the second conductive member further comprises:
a second surface extending radially outward, wherein the RF energy travels along the second surface of the second conductive member after travelling along the first surface of the second conductive member, and wherein the plurality of conductive elements are disposed on the second surface.

16. The substrate processing system of claim 15, wherein the second surface extends from the first surface of the second conductive member.

17. The substrate processing system of claim 15, wherein the second conductive member further comprises:
a third surface extending radially outward from the first surface of the second conductive member and disposed between the first and second surfaces of the second conductive member, wherein RF energy travels along the third surface prior to traveling along the second surface of the second conductive member.

18. The substrate processing system of claim 15, further comprising:
a plurality of conductive elements disposed on the second surface, wherein the RF energy travels from the second surface through the plurality of conductive elements and into the shield and wherein the plurality of conductive elements are symmetrically disposed about the substrate support.

19. The substrate processing system of claim 18, wherein each conductive element is in the shape of a loop.

20. The substrate processing system of claim 18, further comprising:
an RF electrode disposed above the substrate support to provide RF energy to the substrate processing system; and
a RF feed structure coupled to the RF electrode to provide RF energy to the RF electrode from an RF power source, wherein the RF feed structure aligned with central axes of both the RF electrode and the substrate support.

* * * * *